United States Patent [19]

Yamazaki et al.

[11] Patent Number: 5,562,395
[45] Date of Patent: Oct. 8, 1996

[54] NON-CONTACT TYPE MOVING TABLE

[75] Inventors: Nobuto Yamazaki; Minoru Torihata; Shinji Maki, all of Tokyo, Japan

[73] Assignee: Kabushiki Kaisha Shinkawa, Tokyo, Japan

[21] Appl. No.: 466,409

[22] Filed: Jun. 6, 1995

Related U.S. Application Data

[62] Division of Ser. No. 101,847, Aug. 4, 1993, Pat. No. 5,439,341.

[30] Foreign Application Priority Data

Aug. 4, 1992 [JP] Japan ................................ 4-227975

[51] Int. Cl.[6] .................................................. F16C 37/06
[52] U.S. Cl. ................................ 414/676; 384/12
[58] Field of Search ..................... 384/12, 5; 414/676; 180/116–118; 104/23.2, 23.1

[56] References Cited

U.S. PATENT DOCUMENTS 3,449,023  6/1969  Sperman ................................ 384/12
4,974,970  12/1990 Sugita et al. .......................... 384/12
5,104,237  4/1992  Slocum ................................. 384/12

FOREIGN PATENT DOCUMENTS

4-04145218  5/1992  Japan ................................... 384/12

Primary Examiner—Kevin Weldon
Attorney, Agent, or Firm—Koda and Androlia

[57] ABSTRACT

A non-contact type moving table including a guide table having a flat guide surface at the top and a moving table which is placed on the guide table and has a moving surface which faces the guide surface of the guide table. The moving table has air blowing openings that blow out compressed air towards the guide surface of the guide table and air suction openings sucking air from the guide surface of the guide table, thus obtaining a single plane, non-contact type bearing or supporting system via the guide surface and the moving surface. As a result, the structure is simple and overall size can be small with low manufacturing costs. In addition, a wide range of materials can be used to build the moving table system.

1 Claim, 11 Drawing Sheets

NON-CONTACT TYPE MOVING TABLE

This is a division of application Ser. No. 08/101,847, filed Aug. 4, 1993 now U.S. Pat. No. 5,439,341.

BACKGROUND OF THE INVENTION

1. Field of the Invention

The present invention relates to a non-contact type moving table used with, for example, a bonding machine for manufacturing semiconductor devices.

2. Prior Art

Figure 23:
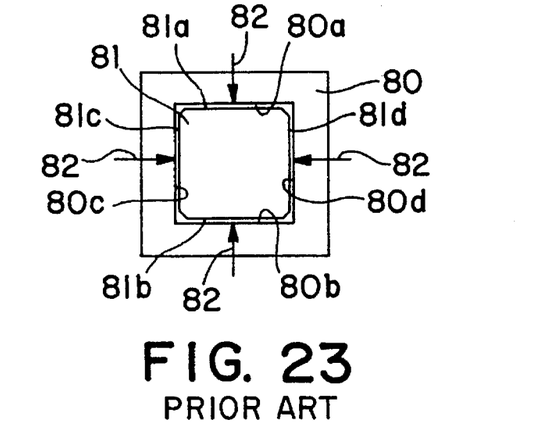
FIG. 23 illustrates a first example of a conventional non-contact type single-axis moving table.
Figure 24:
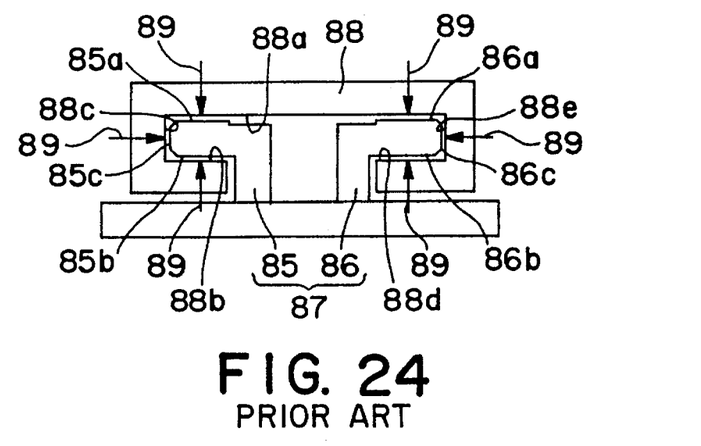
FIG. 24 illustrates a second example of a conventional non-contact type single-axis moving table.
Figure 25:
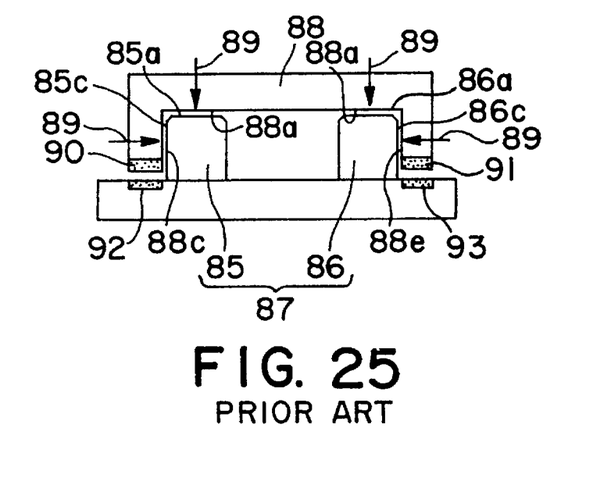
FIG. 25 illustrates a third example of a conventional non-contact type single-axis moving table.

Conventionally, moving tables that use compressed air as shown in FIGS. 23 and 24, and those that use a combined compressed air/magnetic system as shown in FIG. 25, are used as non-contact type single-axis moving tables that are employed in, for example, a semiconductor device manufacturing apparatus.

The compressed air system shown in FIG. 23, that shows the top view thereof, includes a guide table, 80 which has four guide surfaces 80a, 80b, 80c and 80d on each side (top, bottom, left and right in the drawing), and a moving table 81 which has moving surfaces 81a, 81b, 81c and 81d that are separated from the guide surfaces 80a, 80b, 80c and 80d with a gap (or an air gap) of several microns in between.

Compressed air is blown in the directions as shown by arrows 82 against the guide surfaces 80a through 80d of the guide table 80 from the moving surfaces 81a through 81d of the moving table 81. As a result, the moving table 81 floats on the guide table 80, thus forming a non-contact type single-axis moving table.

If an external force is put on the moving table 81 from above the table 81 (or in a direction perpendicular to the surface of the drawing paper), the moving table 81 is moved (without contact) in a single direction relative to the upper surface of the table 80.

On the other hand, the compressed air system shown in FIG. 24, which shows the side view thereof, includes a guide table 87, which has guide parts 85 and 86, and a moving table 88.

The guide part 85 has guide surfaces 85a, 85b and 85c on its upper, lower and left-end surfaces, and the guide part 86 has guide surfaces 86a, 86b and 86c on its upper, lower and right-end surfaces.

The moving table 88 has moving surfaces 88a, 88b, 88c, 88d and 88e which are separated from (or are in non-contact with) the guide surfaces 85a, 85b, 85c, 86a, 86b and 86c with a gap of several microns.

Compressed air is blown in the directions shown by arrows 89 against the guide surfaces 85a, 85b, 85c, 86a, 86b and 86c of the guide table 87 from the moving surfaces 88a through 88e of the moving table 88. As a result, the moving table 88 is caused to float, thus forming a non-contact type single-axis moving table.

Accordingly, if an external force is applied to the moving table 88 from the side (or applied in a direction perpendicular to the surface of the drawing), the moving table 88 is moved laterally (without contact) in a uniaxial direction (or in a perpendicular direction relative to the drawing paper).

FIG. 25 shows the side of the combined compressed air/magnetic system. In this system, the lower section used in the system shown in FIG. 24 is modified.

More specifically, permanent magnets 90 and 91 are installed on the undersurface of a moving table 88, and permanent magnets 92 and 93 which have magnetic poles that attract the permanent magnets 92 and 93 are installed on a guide table 87.

In this system, compressed air is blown in the directions as shown by arrows 89 against the guide surfaces of the guide table 87 from the moving table 88. When the air is thus blown, mutual repulsion is produced by the compressed air blown in the horizontal direction, so that horizontal rigidity is obtained; and in the vertical direction, mutual repulsion is produced by the compressed air and this repulsion is balanced by the attractive force of the permanent magnets 90, 91, 92, and 93, so that vertical rigidity is obtained. Thus, a non-contact type single-axis moving table is obtained in this system, too.

In the prior art described above, a plurality of surfaces are restrained by means of compressed air or by means of compressed air and permanent magnets in order to obtain rigidity and tensile rigidity in the vertical direction. More specifically, a. in the case of the system shown in FIG. 23, two surfaces above and two surfaces below, that is, (1) the guide surface 80a and the moving surface 81a, and (2) the guide surface 80b and the moving surface 81b, are restrained;

b. in the case of the system of FIG. 24, four surfaces above and four surfaces below, that is, (1) the guide surface 85a and the moving surface 88a, (2) the guide surface 86a and the moving surface 88a, (3) the guide surface 85b and the moving surface 88b, and (4) the guide surface 86b and the moving surface 88d, are restrained; and c. in the case of the system of FIG. 25, four surfaces above and four surfaces below, that is, (1) the guide surface 85a and the moving surface 88a, (2) the guide surface 86a and the moving surface 88a, (3) the permanent magnets 90 and 92, and (4) the permanent magnets 91 and 93, are restrained.

On the other hand, if a single-axis moving table is to be created, it is necessary to restrain two surfaces on the left and two surfaces on the right. In other words, a. in the system of FIG. 23, (1) the guide surface 80c and the moving surface 81c, and (2) guide surface 80d and moving surface 81d, and b. in the systems shown in FIGS. 24 and 25, (1) the guide surface 85c and the moving surface 88d, and (2) the guide surface 86c and the moving surface 88e, are restrained by means of the compressed air in order to obtain pressing rigidity and tensile rigidity in the left-right direction in addition to the above-described pressing rigidity and tensile rigidity in the vertical direction.

As seen from the above, at least four surfaces (top, bottom, left and right) are required. Furthermore, in order to create an XY table (which is a biaxial moving table), it is necessary to use two single-axis moving tables and combine them so that the moving tables are installed perpendicular to each other.

In the above prior arts, the number of the necessary surfaces is large. In addition, it is necessary to maintain an extremely small air gap of a few microns between the facing surfaces. Accordingly, high finishing precision is required, and assembly and adjustment of the device are extremely difficult, which results in high manufacturing costs. Furthermore, since the number of the surfaces is large, the moving table is also large in size, weight and complexity, which also causes the higher costs. In addition, since the air gap is extremely small, the effect of thermal expansion becomes large. Thus, the materials which are suitable for the device are limited.

SUMMARY OF THE INVENTION

The object of the present invention is to provide a non-contact type moving table which has a simple structure and uses a lesser number of bearing or support surfaces, is small in size and weight, and is less costly to manufacture. In addition, a broad range of materials can be used to build the moving table.

In order to accomplish the object, the present invention uses a unique structure for a non-contact type moving table that includes a guide table and a moving table. The guide table is formed with a guide surface which is the top surface of the guide table and is flat, and the moving table, which is placed on the guide table, includes a moving surface that is the under surface of the moving table and faces the guide surface of the guide table. On the moving surface of the moving table, air supply holes and vacuum suction holes are provided so that compressed air is blown to the guide surface and also vacuum suction is applied onto the guide surface. With the use of these compressed air supply and vacuum suction provided by the air supply holes and the vacuum suction holes, a single-surface, non-contact type rigid bearing or support is obtained via the two surfaces, that is, the guide surface and the moving surface.

In the above structure, it is possible that both air supply holes and vacuum suction holes are made on the guide surface of the guide table. It is further possible that the air supply holes are made on the guide surface of the guide table and the vacuum suction holes are made on the moving surface of the moving table and that the air supply holes are made on the moving surface of the moving table and the vacuum suction holes are made on the guide surface of the guide table.

With the above structures, the moving table is caused to float up from the guide surface of the guide table by the compressed air blown from the air supply holes onto the guide surface. When the moving table is floating, it is balanced by its own weight and the blowing pressure of the compressed air. However, since the moving table floats in the air without any restraint, it is positionally extremely unstable. Accordingly, vacuum pressure is supplied via the vacuum suction holes. As a result, the gap between the guide surface of the guide table and the moving surface of the moving table is reduced, and the guide surface and moving surface can withstand pressing forces and tensile forces that are applied to the moving table from a perpendicular direction. Thus, a surface-moving rigid bearing or support system is obtained.

Accordingly, when an external force is applied to the moving table from a direction parallel to the guide surface and moving surface, the moving table can move lightly in the direction the external force is applied. Thus, a non-contact rigid bearing or support which has pressing and tensile rigidity is obtained by way of a single plane that consists of a pair of surfaces which are the guide surface and the moving surface.

DETAILED DESCRIPTION OF THE INVENTION

One embodiment of the non-contact type moving table according to the present invention will be described with reference to FIGS. 1 through 7.

Figure 7:
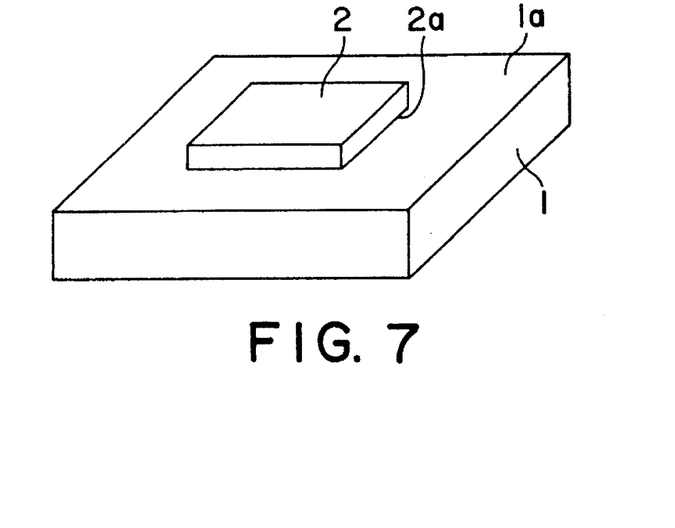
FIG. 7 illustrates another embodiment of the non-contact type moving table according to the present invention.

As shown in FIG. 7, basically a moving table 2 is installed on the guide table 1. In other words, the upper surface of the guide table 1 is a guide surface 1a, and a moving table 2 is carried on this guide surface 1a. The undersurface of the moving table 2 is a moving surface 2a.

Figure 1:
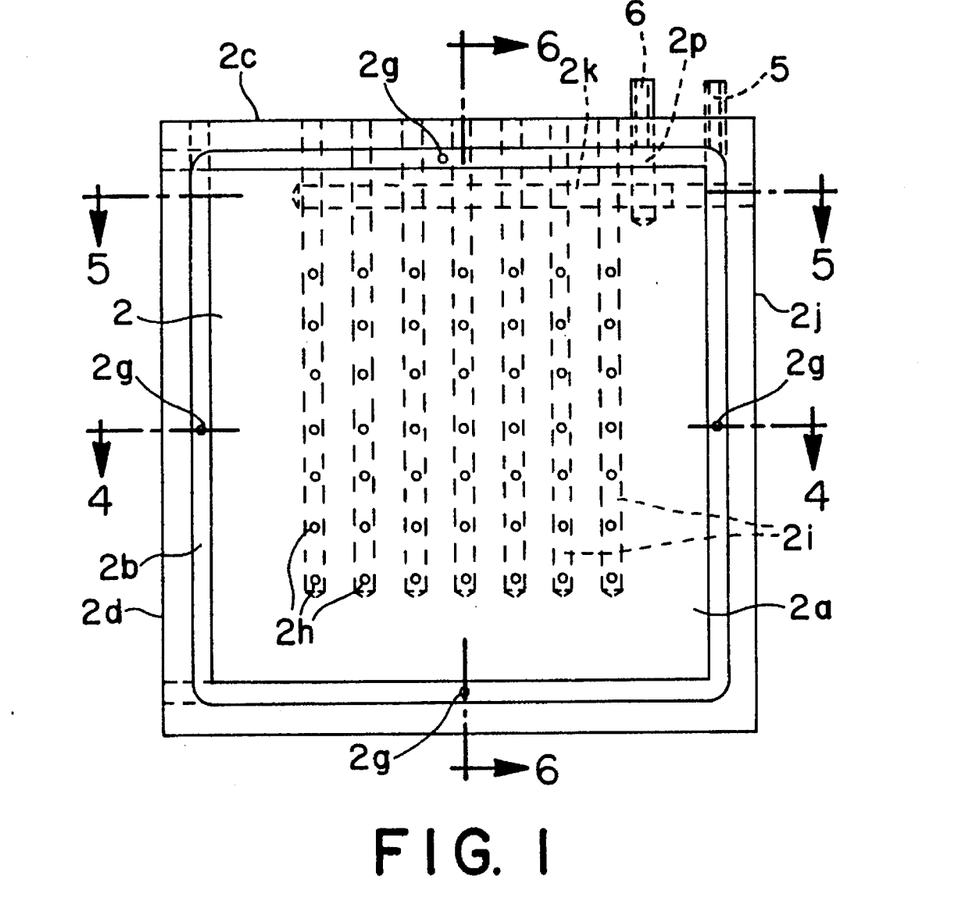
FIG. 1 shows the moving surface of a moving table according to the basic structure of one embodiment of a non-contact type moving table of the present invention.

FIG. 1 shows the undersurface or the moving surface 2a of the moving table 2, and an air supply groove 2b which is arranged so as to be parallel to the four side edges of the moving surface 2a is formed in the moving surface 2a.

Figures 3, 4:
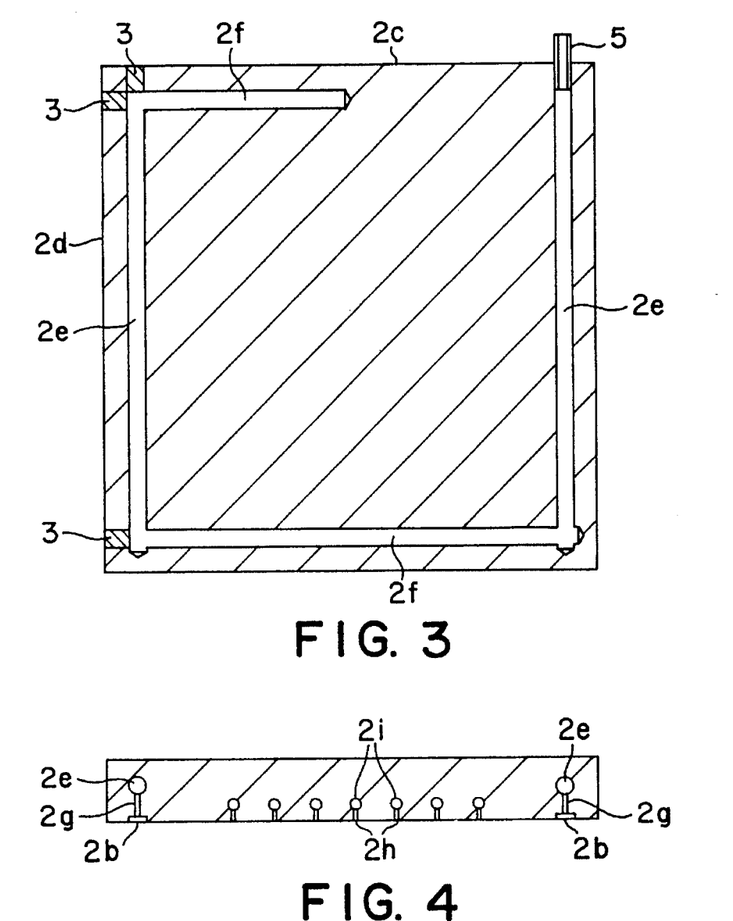
FIG. 3 is a cross section taken along the line 3—3 in FIG. 2.
FIG. 4 is a cross section taken along the line 4—4 in FIG. 1.
Figure 5:
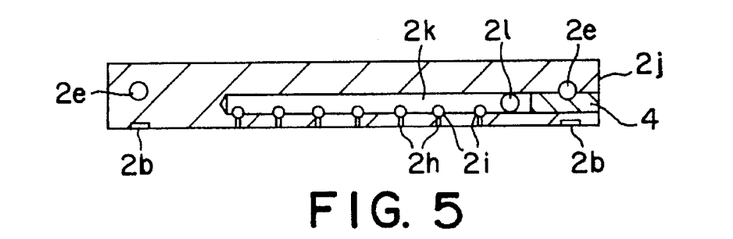
FIG. 5 is a cross section taken along the line 5—5 in FIG. 1.
Figure 6:
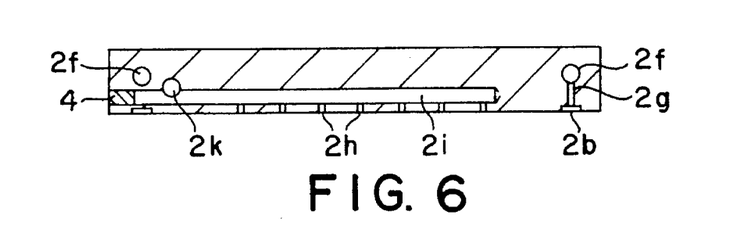
FIG. 6 is a cross section taken along the line 6—6 in FIG. 1.

As seen from FIG. 3, air passage holes 2e are provided inwardly from the side surface 2c of the moving table 2 so that the holes 2e are above the air supply groove 2b. Furthermore, air passage holes 2f are provided inwardly from the side surface 2d of the moving table 2 so that they are connected with the air passage holes 2e. The open end of the air passage hole 2e which is parallel to the side surface 2d and the open ends of the air passage holes 2f that are parallel to the side surfaces 2c and 2f are closed off by plugs 3.

Figure 2:
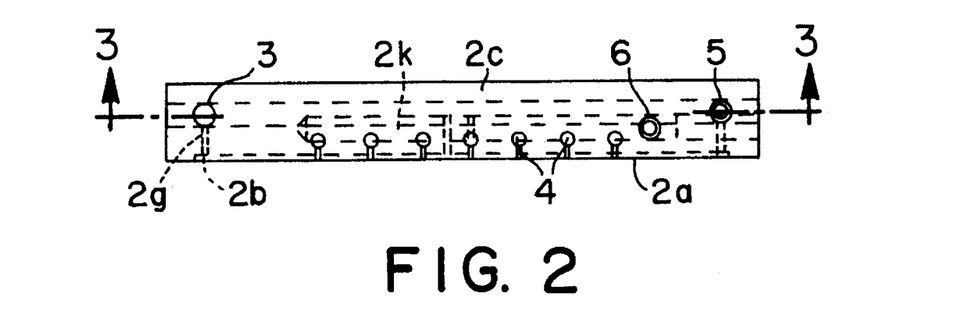
FIG. 2 is a side view thereof.

As shown in FIGS. 1, 2 and 4, four air supply holes 2g are formed in each one of the four sides of the square-shaped air supply groove 2b so that the air supply groove 2b is connected with the air passage holes 2e and 2f via the air supply holes 2g.

A plurality of vacuum suction holes 2h are opened in the moving surface 2a of the moving table 2. The suction holes 2h, which are vertical in FIGS. 2 and 4 through 6, are arranged in rows so as to locate the inner side of the air supply groove 2b. In addition, air passage holes 2i, which are horizontal in FIGS. 2 and 4 through 6, are formed so as to run inwardly from the side surface 2c so that the air passage holes 2i are connected to the vacuum suction holes 2h. An air passage hole 2k is provided so as to be parallel to the side surface 2c, and the end of the air passage hole 2k opens in the side surface 2j. The air passage hole 2k is at right angles relative to the vacuum suction holes 2h and connected with the air passage holes 2i. The ends of these air passage holes 2i and 2k are closed off by plugs 4.

An air passage hole 2p is formed in the side surface 2c so that the air passage hole 2p is connected with the air passage hole 2k. In addition, an air supply pipe 5 which supplies air to the air passage holes 2e and 2f, and an air suction pipe 6 which applies vacuum suction to the air passage holes 2p, 2k, 2i and 2h, are connected to the moving table 2.

Figure 8:
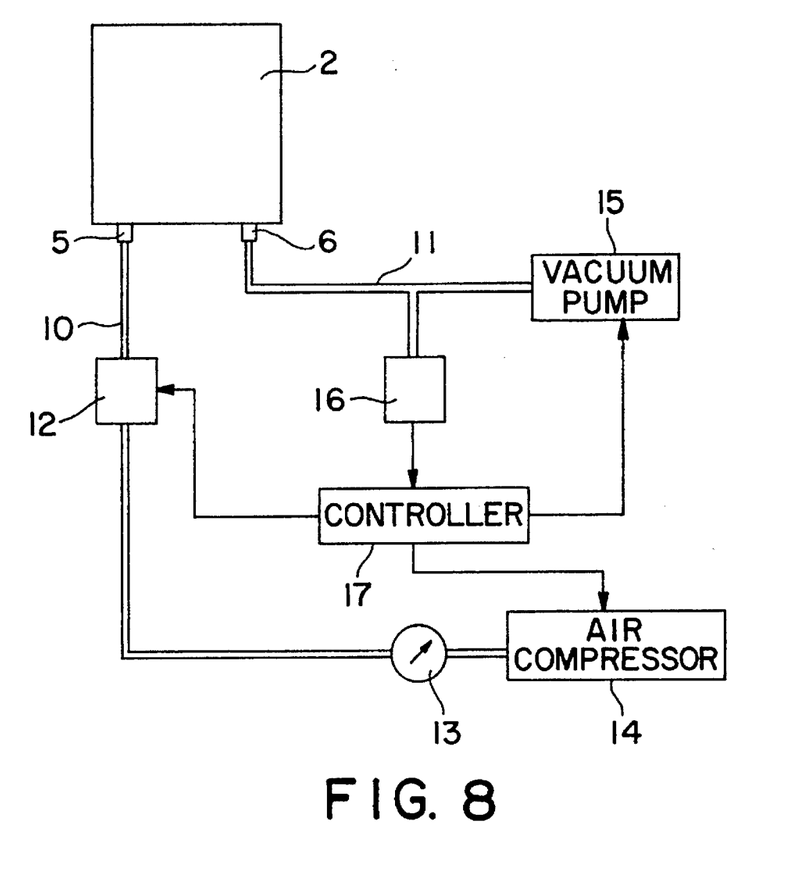
FIG. 8 is a block diagram of a compressed air supply and air suction device used in the moving table.

FIG. 8 shows the air supply and air suction systems for the moving table 2. Hoses 10 and 11 are connected to the air supply pipe 5 and air suction pipe 6. An air compressor 14 is connected to the hose 10 via an automatic flow rate regulator 12 and a pressure gauge 13. A vacuum pump (or venturi type vacuum generator) 15 and a vacuum pressure sensor 16 are connected to the hose 11.

It is desirable to use a flexible material for the portions of the hoses 10 and 11 that are located in the vicinity of the air supply pipe 5 and air suction pipe 6 in order to reduce the resistance offered by the hoses 10 and 11 to the moving table 2.

The air compressor 14 and the vacuum pump 15 are controlled by a controller 17, and the flow rate of the automatic flow rate regulator 12 is also controlled by the controller 17 in accordance with the degree of the vacuum indicated by the vacuum pressure sensor 16.

The operation of the above described moving table 2 will be described below:

When compressed air is supplied to the air supply pipe 5, the compressed air passes through the air passage holes 2e and 2f and is supplied to the air supply groove 2b via the air supply holes 2g. As a result, the moving table 2 floats upward from the guide surface 1a of the guide table 1.

When the moving table floats, it is balanced by its own weight and the pressure of the supplied compressed air. However, the moving table 2 floats in the air without any restraint, the table is unstable. Thus, vacuum suction is applied via the air suction pipe 6, and this vacuum suction force passes through the air passage holes 2p, 2k and 2i and applies suction via the vacuum suction holes 2h to the air in the area between the guide surface 1a of the guide table 1 and the moving surface 2a of the moving table 2. As a result, the gap between the guide surface 1a of the guide table 1 and the moving surface 2a of the moving table 2 is reduced, and the moving table 2 can withstand both a pressing force and a tensile force that are applied from above, that is, in the direction perpendicular to the guide surface 1a and the moving surface 2a. Thus, a surface-moving rigid bearing is obtained.

Accordingly, when an external force is applied to the moving table 2 from a lateral direction (i. e., from a direction parallel to the guide surface 1a and the moving surface 2a), the moving table 2 moves lightly in the direction in which the external force is applied. The moving table 2 is moved by a force of a few grams.

As seen from above, a non-contact rigid bearing or support which has a pressing rigidity and a tensile rigidity is formed in one plane that consists of one pair of the surfaces, i. e., the guide surface 1a and the moving surface 2a, and a non-contact surface-moving table is thus obtained. Also, since air supply and air suction are executed to these paired surfaces, auto-circulation of the air is obtained, and the cleanness is kept with almost no leakage of air into other portion of the table.

Figure 9:
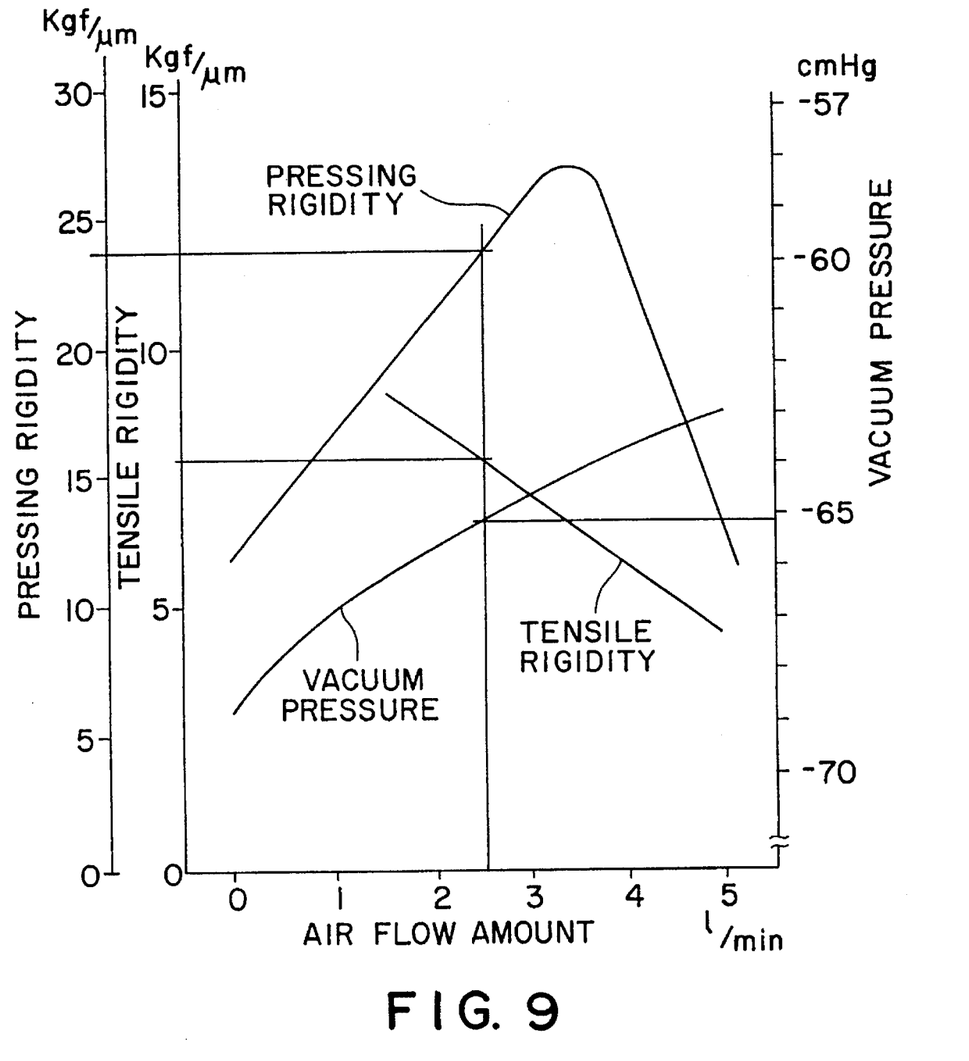
FIG. 9 is a graph showing the relationship of the air flow rate, the vacuum pressure, the pressing rigidity and the tensile rigidity.

FIG. 9 shows a graph of a test result for the tensile rigidity and pressing rigidity obtained in such a way that the vacuum pressure applied to the air suction pipe 6 was increased in accordance with the flow rate of the air supplied to the air supply pipe 5.

As seen from this graph, if the air flow rate is set, for example, at 2.5 L/min, and the vacuum pressure is at −65 cmHg, the tensile rigidity is approximately 8 Kgf/micron, and the pressing rigidity is approximately 24 Kgf/micron. The value of the pressing rigidity is ascertained by finding the weight of the objects placed on the moving table 2.

Next, embodiments of a non-contact type moving table according to the present invention will be described.

Figure 10:
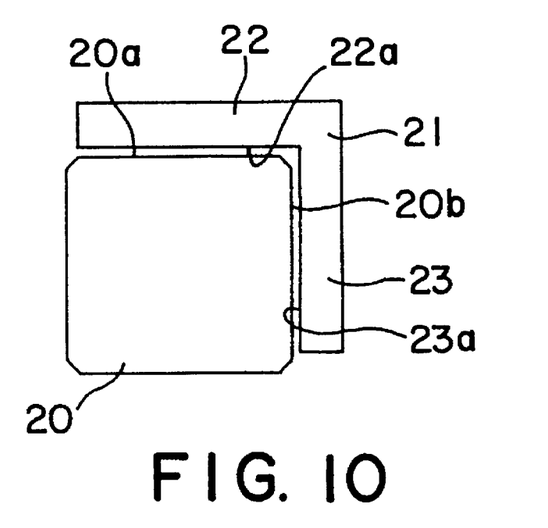
FIG. 10 illustrates one embodiment of a non-contact type single-axis moving table according to the present invention.

FIG. 10 schematically shows a first embodiment of a single-axis moving table that is provided based upon the invention described above which includes a guide table 20 and a moving table 21.

The upper surface of the guide table 20 and the side surface which is perpendicular to the upper surface are defined as guide surfaces 20a and 20b. On the other hand, the moving table 21 includes moving sections 22 and 23 that respectively have a moving surface 22a and 23a which face the guide surfaces 20a and 20b, respectively.

An air blowing system and an air suction system which are constructed in the same manner as the moving table 2 illustrated in FIGS. 1 through 6 are respectively provided in each of the moving sections 22 and 23 of the moving table 21.

In other words, the guide surface 20a of the guide table 20 and the moving surface 22a of the moving table 22 form a rigid bearing or support which is constructed in the same manner as the rigid bearing obtained by the guide surface 1a of the guide table 1 and the moving surface 2a of the moving table 2. Also, the guide surface 20b of the guide table 20 and the moving surface 23a of the moving table 23 form a rigid bearing or support which is obtained in the same manner as the rigid bearing obtained by the guide surface 1a of the guide table 1 and the moving surface 2a of the moving table 2.

Accordingly, the moving section 22 forms a rigid bearing or support which is able to withstand a pressing force and a tensile force applied from a vertical direction (i.e., a direction perpendicular to the guide surface 20a and moving surface 22a). Also, the moving section 23 forms a rigid bearing or support which is able to withstand a pressing force and a tensile force applied from a left-right direction (i.e., a direction perpendicular to the guide surface 20b and moving surface 23a).

As seen from the above, the moving table 21 is restrained not only in the vertical direction but also in the left-right direction (i.e., in the direction perpendicular to the guide surface 20a and moving surface 22a, and in the direction perpendicular to the guide surface 20b and moving surface 22a). Accordingly, the moving table 21 can move in a non-contact fashion relative to the guide table 20 only in the direction parallel to the guide surfaces 20a and 20b and the moving surfaces 22a and 23a(in other words, the table 21 is movable in a perpendicular direction relative to the surface of the drawing sheet).

Accordingly, by combining the moving sections 22 and 23 in such an arrangement that those sections are perpendicular to each other, and by causing the moving sections to be carried on the guide table 20 which has two guide surfaces 20a and 20b that are perpendicular to each other, non-contact rigid bearings or supports are formed with a small number of bearing or supporting surfaces, i.e., two planes that consist of two pairs of surfaces, which are (i) the guide surface 20a and the moving surface 22a, and (ii) the guide surface 20b and the moving surface 23a. A single-axis or single-direction moving table is thus obtained.

In the above embodiment, since the number of the bearing or support surfaces is small, the moving table 2 can be light in weight, and the manufacturing costs can be low. Also, since the bearings or supports are formed in two planes which are perpendicular to each other, the effect of thermal expansion is small, and a broad range of materials can be used for the guide table 1 and the moving table 2. Moreover, since there is no need to control the air gap with high precision, the assembly, adjustment and finishing can be performed easily.

Figure 11:
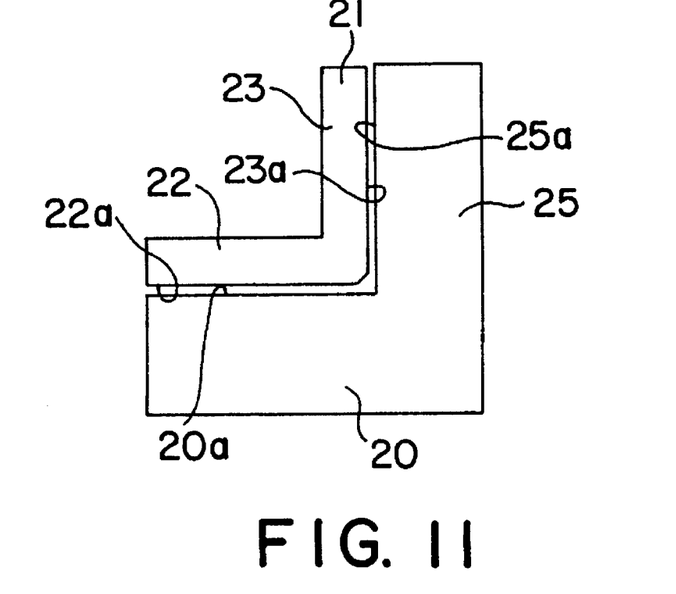
FIG. 11 illustrates another embodiment of a non-contact type single-axis moving table according to the present invention.

FIG. 11 illustrates a second embodiment of a single-axis or single direction moving table, which is a modification of the table shown in FIG. 11.

In this embodiment, a guide section 25 which extends upward from the upper surface 20a of the guide table 20 is used instead of the guide surface 20b(which is a side surface of the guide table 20 of first embodiment), and a vertical guide surface 25a is formed on this guide section 25. Because of this structure, the moving section 23 of the moving table 22 is designed so as to extend upward, and a vertical moving surface 23a is formed on this guide section 23.

An effect equivalent to that obtained by the embodiment of FIG. 10 can be obtained using this type of structure as well.

Figure 12:
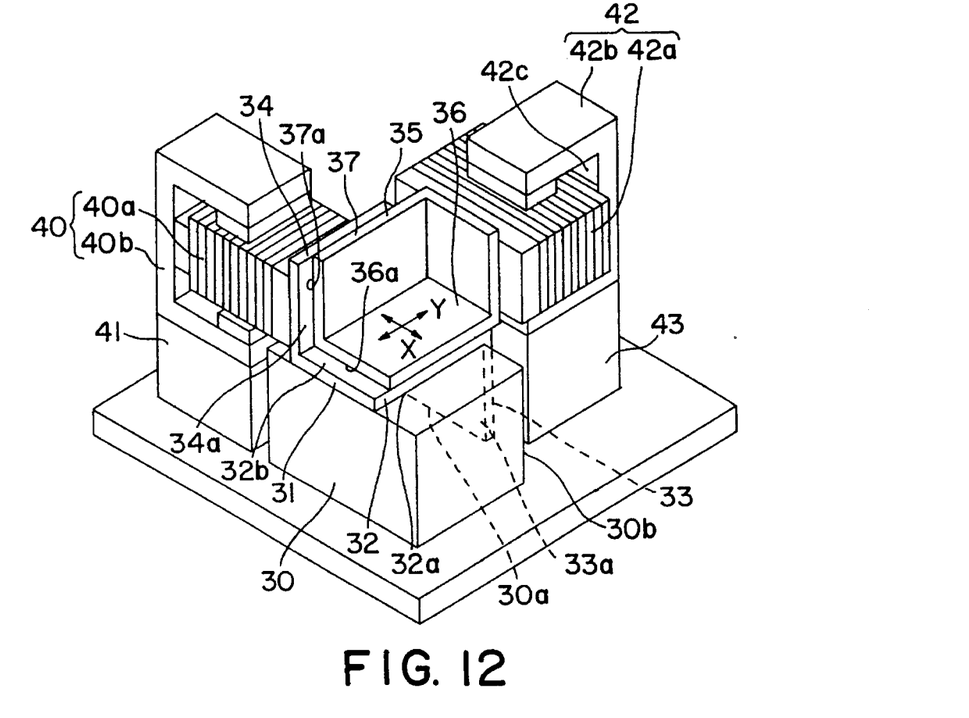
FIG. 12 illustrates a first embodiment of a non-contact type biaxial moving table according to the present invention.

FIG. 12 illustrates a first embodiment of a biaxial or two direction moving table obtained pursuant to the present invention.

The upper surface and one inner side surface of an X-axis guide table 30 are X-axis guide surfaces 30a and 30b. The X-axis guide surfaces 30a and 30b are equivalent to the upper and side guide surfaces 20a and 20b of the guide table 20 shown in FIG. 10.

An X-axis moving table 31 is carried on the X-axis guide table 30. The X-axis moving table 31 comprises (1) X-axis moving sections 32 and 33 which have X-axis moving surfaces 32a and 33a that respectively face the X-axis guide surfaces 30a and 30b, and (2) a Y-axis guide section 34 which has a Y-axis guide surface 34a consisting of a flat surface that is perpendicular to the X-axis guide surface 30a and parallel to the Y axis. The upper surface of the X-axis moving section 32 is a Y-axis guide surface 32b that is a horizontal flat surface. The X-axis moving surfaces 32a and 33a are equivalent to the under and side moving surfaces 22a and 23a of the moving table 21 shown in FIG. 10.

In other words, an X-axis table is obtained by the X-axis guide table 30 and X-axis moving table 31. A Y-axis moving table 35 is carried on the X-axis moving table 31.

The Y-axis moving table 35 comprises Y-axis moving sections 36 and 37 which have Y-axis moving surfaces 36a and 37a formed on the surfaces facing the Y-axis guide surfaces 32b and 34a. In other words, the Y-axis guide surfaces 32b and 34a are respectively equivalent to the guide surfaces 20a and 25a of the guide table 20 shown in FIG. 11, and the Y-axis moving surfaces 36a and 37a of the Y-axis moving table 35 are equivalent to the moving surfaces 22a and 23a of the moving table 21 shown in FIG. 11. Accordingly, a Y-axis table is obtained by the X-axis moving table 31 and the Y-axis moving table 35.

As seen from the above, the movement of the X-axis moving table 31 in the direction of the Y axis (i.e., in the direction perpendicular to the plane of the X-axis guide surface 30b of the X-axis guide table 30 and the X-axis moving surface 33a of the X-axis moving table 31) is restricted by the X-axis guide surface 30b of the X-axis guide table 30 and by the X-axis moving surface 33a of the X-axis moving table 31. Accordingly, the X-axis moving table 31 can move only in the direction of the X axis as shown by the arrows and along the X-axis guide surface 30b of the X-axis guide table 30.

Furthermore, the movement of the Y-axis moving table 35 in the direction of the X-axis (i.e., in the direction perpendicular to the plane of the Y-axis guide surface 34a of the X-axis moving table 31 and the Y-axis moving surface 37a of the Y-axis moving table 35) relative to the X-axis moving table 31 is restricted by the Y-axis guide surface 34a of the X-axis moving table 31 and by the Y-axis moving surface 37a of the Y-axis moving table 35. Accordingly, the Y-axis moving table 35 moves along with the X-axis moving table 31 in the direction of the X axis when the X-axis moving table 31 is moved in the direction of the X axis as described above.

In addition, the movement of the Y-axis moving table 35 in the direction of the X axis is restricted by the Y-axis guide surface 34a and by Y-axis moving surface 37a as described above. Thus, the Y-axis moving table 35 can move only in the direction of the Y axis.

Accordingly, by combining the movement of the X-axis moving table 31 in the direction of the X axis and the movement of the Y-axis moving table 35 in the direction of the Y axis, it is possible to move the Y-axis moving table 35 to any desired position along the X and Y axes. In other words, by combining the two moving tables 21 of the types shown in FIGS. 10 and 11, non-contact bearings or supports are formed by four planes made up by four pairs of surfaces which are (1) the X-axis guide surface 30a and the X-axis moving surface 32a, (2) the X-axis guide surface 30b and the X-axis moving surface 33a, (3) the Y-axis guide surface 32b and the Y-axis moving surface 36a, and (4) the Y-axis guide surface 34a and the Y-axis moving surface 37a. Thus, a biaxial or two direction moving table is obtained.

Meanwhile, the coil 40a of an X-axis voice coil motor 40 is mounted to the Y-axis guide section 34 of the X-axis moving table 31 on the opposite side surface of the Y-axis guide section 34 from the Y-axis guide surface 34a. In addition, the magnet 40b of the X-axis voice coil motor 40 is mounted to an X-axis motor stand 41. Furthermore, the coil 42a of a Y-axis voice coil motor 42 is mounted to one surface of the Y-axis moving table 35 (i.e., a surface which is perpendicular to the Y axis), and the magnet 42b of the Y-axis voice coil motor 42 is mounted to a Y-axis motor stand 43.

As a result, the X-axis moving table 31 can be moved in the direction of the X axis by the X-axis voice coil motor 40, the Y-axis moving table 35 can be moved in the direction of the Y axis by the Y-axis voice coil motor 42, and the movements of the X-axis moving table 31 and Y-axis moving table 35 can be automatically controlled.

As described above, the coil 42a is mounted to the Y-axis moving table 35, and the Y-axis moving table 35 moves along with the X-axis moving table 31 when the X-axis moving table 31 is moved in the direction of the X axis. However, the magnet 42b of the motor 40 is mounted to the Y-axis motor stand 43 and therefore does not move. Accordingly, a gap which is sufficient to allow the movement of the Y-axis moving table 35 in the direction of the X axis along with the X-axis moving table 31 is formed between the coil 42a and the portion 42c of the magnet 42b that is installed inside the coil part 42a.

Figure 13:
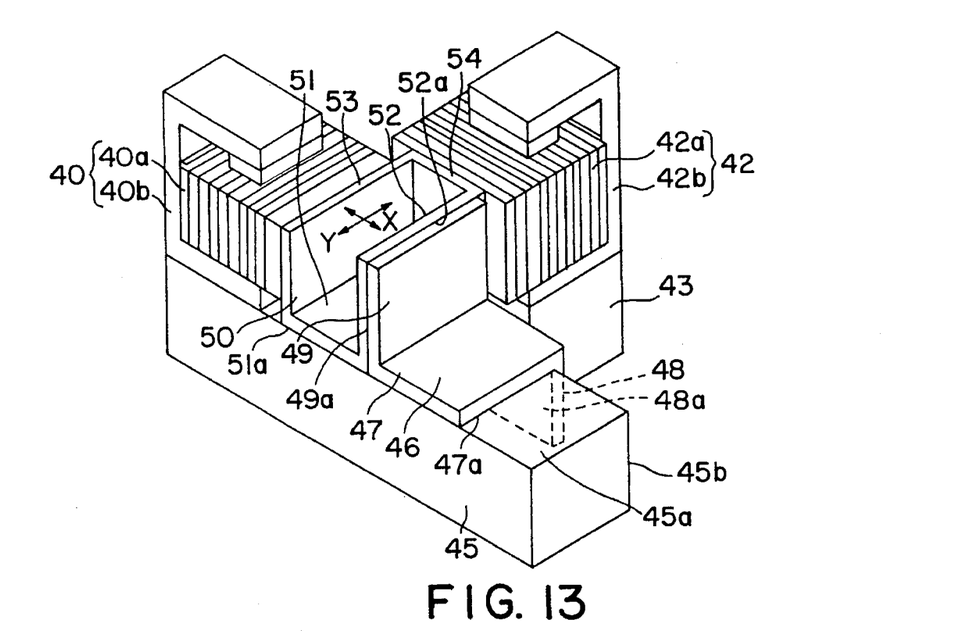
FIG. 13 illustrates a second embodiment of a non-contact type biaxial moving table according to the present invention.

FIG. 13 illustrates a second embodiment of a biaxial or two direction moving table, which is a modification of the first embodiment shown in FIG. 12, which is a biaxial moving table.

The upper surface of a guide table 45 is an XY-axis guide surface 45a, while the inner side surface of the guide table 45 is an X-axis guide surface 45b.

A first XY-axis moving table 46 is carried on the guide table 45. This first table 46 comprises (1) X-axis moving sections 47 and 48 which have X-axis moving surfaces 47a and 48a that respectively face the XY-axis guide surface 45a and X-axis guide surface 45b, and (2) a Y-axis guide section 49 which has a Y-axis guide surface 49a that is a flat surface perpendicular to the XY-axis guide surface 45a and parallel to the Y axis.

A second XY-axis moving table 50 is also carried on the guide table 45. This second table 50 comprises (1) Y-axis moving sections 51 and 52 which have Y-axis moving surfaces 51a, and 52a that respectively face the XY-axis guide surface 45a and Y-axis guide surface 49a, (2) an X-axis motor attachment section 53 which is perpendicular to the X axis, and (3) a Y-axis motor attachment section 54 which is perpendicular to the Y axis.

Of the above, the XY-axis guide surface 45a and the X-axis guide surface 45b are equivalent to the X-axis guide surfaces 30a and 30b of the X-axis guide table 30 shown in FIG. 12, and the X-axis moving surfaces 47a and 48a are equivalent to the X-axis moving surfaces 32a and 33a of the X-axis moving table 31 shown in FIG. 12. In other words, an X-axis table is obtained by the guide table 45 and the first XY-axis moving table 46.

Furthermore, the XY-axis guide surface 45a and Y-axis guide surface 49a are equivalent to the Y-axis guide surfaces 32b and 34a of the X-axis moving table 31 shown in FIG. 12, and the Y-axis moving surfaces 51a and 52a are equivalent to the Y-axis moving surfaces 36a and 37a of the Y-axis moving table 35 shown in FIG. 12. In other words, a Y-axis table is obtained by the guide table 45, the Y-axis guide section 49 of the first XY-axis moving table 46, and the second XY-axis moving table 50.

Accordingly, the movement of the first XY-axis moving table 46 in the direction of the Y axis (i.e., in the direction perpendicular to the plane of the X-axis guide surface 45b) of the guide table 45 and the X-axis moving surface 48a of the XY-axis moving table 46 is restricted by the X-axis guide surface 45b of the guide table 45 and by the X-axis moving surface 48a of the first XY-axis moving table 46. Thus, the XY-axis moving table 46 can move only in the direction of the X axis along the X-axis guide surface 45b of the guide table 45.

Furthermore, the movement of the second XY-axis moving table 50 in the direction of the X axis (i.e., in the direction perpendicular to the plane of the Y-axis guide surface 49a of the XY-axis moving table 46 and the Y-axis moving surface 52a of the XY-axis moving table 50) is restricted by the Y-axis guide surface 49a of the first XY-axis moving table 46 and by the Y-axis moving surface 52a of the second XY-axis moving table 50. Thus, the second XY-axis moving table 50 moves together with the first XY-axis moving table 46 in the direction of the X axis when the first XY-axis moving table 46 is moved in the direction of the X axis as described above.

Conversely, if the second XY-axis moving table 46 is moved in the direction of the X axis, the first XY-axis moving table 46 moves together with the second XY-axis moving table 50. Furthermore, since the second XY-axis moving table 50 can move together with the first XY-axis moving table 46 in the direction of the X axis as described above, the second XY-axis moving table 50 can move only in the direction of the Y axis when the second XY-axis moving table 50 is moved in the direction of the Y axis.

Accordingly, by combining the movement of the second XY-axis moving table 50 in the direction of the X axis and the movement of the second XY-axis moving table 50 in the direction of the Y axis, or combining the movement of the first XY-axis moving table 46 in the direction of the X axis and the movement of the second XY-axis moving table 50 in the direction of the Y axis, it is possible to move the second XY-axis moving table 50 to any desired directions along the X and Y axes.

In other words, as in the previously described embodiment, an XY moving table of a non-contact biaxial type is formed by four planes.

Accordingly, the movement of the second XY-axis moving table 50 to any desired position along the X and Y axes can be automatically controlled as in the case of FIG. 12 by mounting (a) the coil 40a of the X-axis voice coil motor 40 to the X-axis motor attachment 53 of the second XY-axis moving table 50, (b) the magnet 40b of this X-axis voice coil motor 40 to the guide table 45, (c) the coil 42a of a Y-axis voice coil motor 42 to the Y-axis motor attachment 54, and (d) the magnet 42b of this Y-axis voice coil motor 42 to the Y-axis motor stand 43.

The embodiment described above is designed so that the second XY-axis moving table 50 is moved in the direction of the X axis by the X-axis voice coil motor 40. However, it is possible to move the first XY-axis moving table 46 in the direction of the X axis by the X-axis voice coil motor 40.

Figure 14:
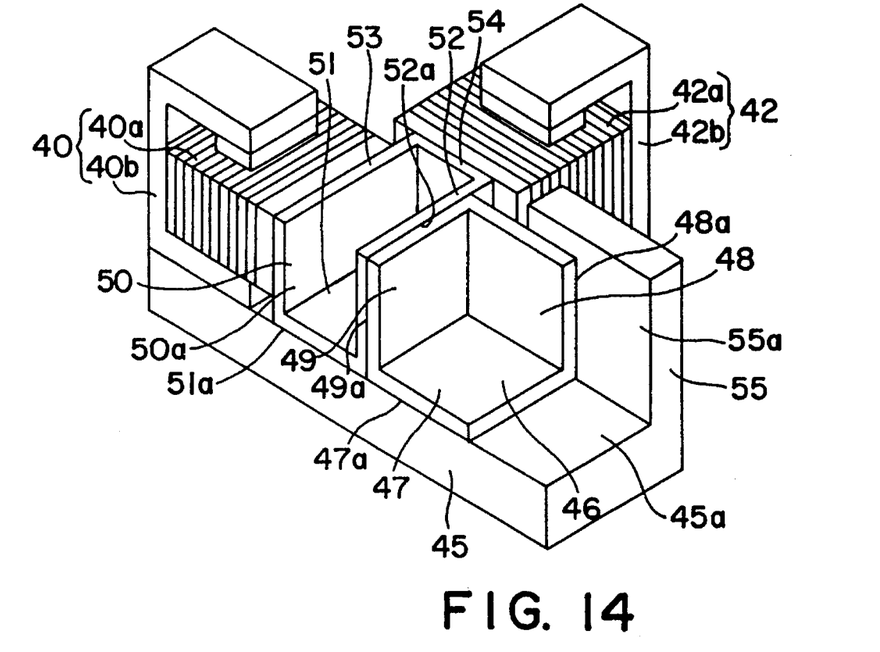
FIG. 14 illustrates a third embodiment of a non-contact type biaxial moving table according to the present invention.

FIG. 14 illustrates a third embodiment of a biaxial or two direction moving table, which is a modification of the second embodiment shown in FIG. 13. The components which are the same as in FIG. 13, or which correspond to the components in FIG. 13, are labeled with the same reference numerals.

As described above, the X-axis table obtained by the guide table 45 and the XY-axis moving table 46 in the second embodiment is constructed as shown in FIG. 10. In this third embodiment, however, an X-axis guide surface 55a which is parallel to the X axis is formed on an X-axis guide section 55 which extends upward in a perpendicular direction relative to the guide table 45. Accordingly, the X-axis moving section 48 of the first XY-axis moving table 46 also extends perpendicularly upward, and an X-axis moving surface 48a which is parallel to the X axis is formed on this X-axis moving section 48. In other words, the X-axis table obtained by the guide table 45 and XY-axis moving table 46 is constructed as shown in FIG. 11.

An effect equivalent to that obtained in the previous embodiments can be obtained with the use of this construction.

Figure 15:
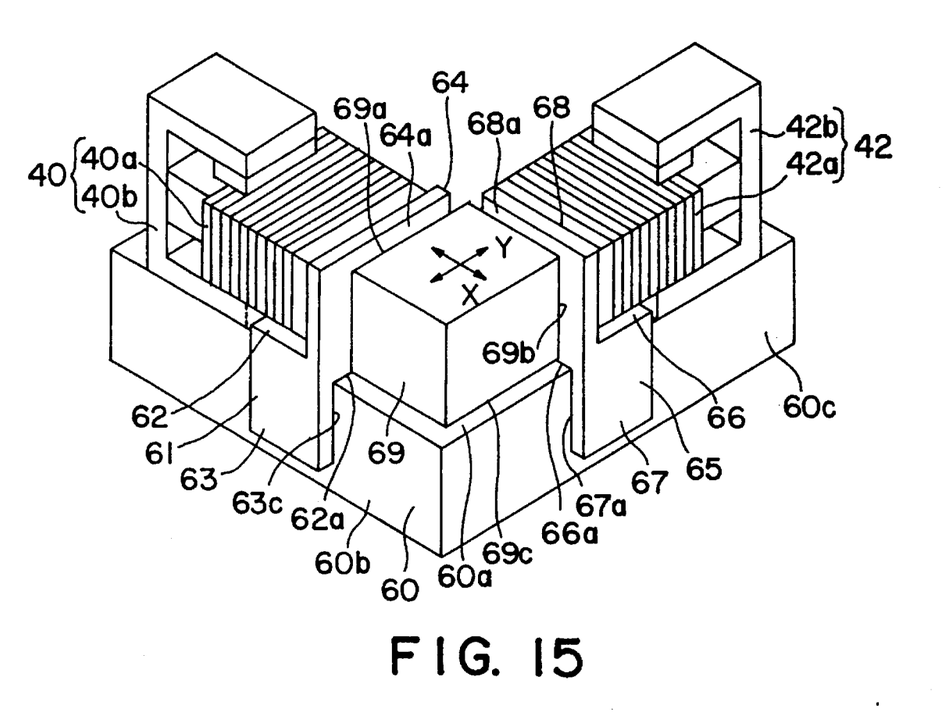
FIG. 15 illustrates a fourth embodiment of a non-contact type biaxial moving table according to the present invention.

FIG. 15 illustrates a fourth embodiment of a biaxial or two direction moving table.

In this embodiment, the guide table 60 includes (1) an XY-axis guide surface 60a in the form of the flat upper surface of the guide table 60, (2) an X-axis guide surface 60b in the form of a perpendicular side surface which is parallel to the X axis, and (3) a Y-axis guide surface 60c in the form of a perpendicular side surface which is parallel to the Y axis.

An X-axis moving table 61 is carried on the guide table 60, and it comprises (1) X-axis moving sections 62 and 63 which have X-axis moving surfaces 62a and 63a that respectively face the XY-axis guide surface 60a and X-axis guide surface 60b, and (2) a Y-axis guide section 64 which has a Y-axis guide surface 64a in the form of a flat surface that is perpendicular to the XY-axis guide surface 60a and parallel to the Y axis.

Furthermore, a Y-axis moving table 65 is carried on the guide table 60, and it comprises (1) Y-axis moving sections 66 and 67 which have Y-axis moving surfaces 66a and 67a that respectively face the XY-axis guide surface 60a and Y-axis guide surface 60c, and (2) an X-axis guide section 68 which has an X-axis guide surface 68a in the form of a flat surface that is perpendicular to the XY-axis guide surface 60a and parallel to the X axis.

In addition, an XY-axis moving table 69 is carried on the guide table 60, and it comprises (1) a Y-axis moving surface 69a, (2) an X-axis moving surface 69b, and (3) an XY-axis moving surface 69c which respectively correspond to (1) the Y-axis guide surface 64a of the Y-axis guide section 64, (2) the X-axis guide surface 68a of the X-axis guide section 68, and (3) the XY-axis guide surface 60a of the guide table 60.

Here, the XY-axis guide surface 60a and the X-axis guide surface 60b are respectively equivalent to the X-axis guide surfaces 30a and 30b of the X-axis guide table 30 shown in FIG. 12. Also, the X-axis moving surfaces 62a and 63a are respectively equivalent to the X-axis moving surfaces 32a and 33a of the X-axis moving table 31 shown in FIG. 12. In addition, the relationship of the XY-axis guide surface 60a, the Y-axis guide surface 60c and the Y-axis moving surfaces 66a and 67a is the same as the relationship of the XY-axis guide surface 60a, the X-axis guide surface 60b and the X-axis moving surfaces 62a and 63a. The only difference is that the axis is changed to the direction of the Y axis.

Accordingly, the movement of the X-axis moving table 61 in the direction of the Y axis (i.e., in the direction perpendicular to the plane of the X-axis guide surface 60b of the guide table 60 and the X-axis moving surface 63a of the X-axis moving table 61) is restricted by the X-axis guide surface 60b of the guide table 60 and by the X-axis moving surface 63a of the X-axis moving table 61. Thus, the X-axis moving table 61 can move only in the direction of the X axis along the X-axis guide surface 60b of the guide table 60.

Similarly, the movement of the Y-axis moving table 65 in the direction of the X axis (i.e., in the direction perpendicular to the plane of the Y-axis guide surface 60c of the guide table 60 and the Y-axis moving surface 67a of the Y-axis moving table 65) is restricted by the Y-axis guide surface 60c of the guide table 60 and by the Y-axis moving surface 67a of the Y-axis moving table 65. Thus, the Y-axis moving table 65 can move only in the direction of the Y axis along the Y-axis guide surface 60c of the guide table 60.

Furthermore, the XY-axis guide surface 60a and X-axis guide surface 68a are equivalent to the Y-axis guide surfaces 32b and 34a of the X-axis moving table 31 shown in FIG. 12. Also, the XY-axis moving surface 69c and X-axis moving surface 69b are equivalent to the Y-axis moving surfaces 36a and 37a of the Y-axis moving parts 36 and 37 shown in FIG. 12. Moreover, the relationship of the XY-axis guide surface 60a, the Y-axis guide surface 64a, the XY-axis moving surface 69c and the Y-axis moving surface 69a is the same as the relationship of the XY-axis guide surface 60, the X-axis guide surface 68a, the XY-axis moving surface 69c and the X-axis moving surface 69b. Only the difference between FIG. 12 and FIG. 15 is that the axis is changed to the direction of the Y axis.

Accordingly, the movement of the XY-axis moving table 69 in the direction of the Y axis (i.e., in the direction perpendicular to the plane of the X-axis guide surface 68a of the Y-axis moving table 65 and the X-axis moving surface 69b of the XY-axis moving table 69) is restricted by the X-axis guide surface 68a of the Y-axis moving table 65 and by the X-axis moving surface 69b of the XY-axis moving table 69. Thus, when the X-axis moving table 61 moves in the direction of the X axis, the XY-axis moving table 69 moves together with the X-axis moving table 61 in the direction of the X axis along the X-axis guide surface 68a of the Y-axis moving table 65.

Similarly, the movement of the XY-axis moving table 69 in the direction of the X axis (i.e., in the direction perpendicular to the plane of the Y-axis guide surface 64a of the X-axis moving table 61 and the Y-axis moving surface 69a of the XY-axis moving table 69) is restricted by the Y-axis guide surface 64a of the X-axis moving table 61 and by the Y-axis moving surface 69a of the XY-axis moving table 69. Accordingly, when the Y-axis moving table 65 moves in the direction of the Y axis, the XY-axis moving table 69 moves together with the Y-axis moving table 65 in the direction of the Y axis along the Y-axis guide surface 64a of the X-axis moving table 61.

Thus, by combining the movement of the X-axis moving table 61 in the direction of the X axis and the movement of the Y-axis moving table 65 in the direction of the Y axis, it is possible to move the XY-axis moving table 69 to any desired position on the X and Y axes.

Thus, an X-axis moving table is obtained by two planes consisting of two pairs of surfaces, i.e., (i) the XY-axis guide surface 60a and the X-axis moving surface 62a, and (ii) the X-axis guide surface 60b and the X-axis moving surface 63a. Also, a Y-axis moving table is obtained by two planes consisting of two pairs of surfaces, i.e., (i) the XY-axis guide surface 60a and the Y-axis moving surface 66a, and (ii) the Y-axis guide surface 60c and the Y-axis moving surface 67a. Furthermore, an XY-axis moving table is obtained by three planes consisting of three pairs of surfaces, i.e., (i) the Y-axis guide surface 64a and the Y-axis moving surface 69a, (ii) the X-axis guide surface 68a and the X-axis moving surface 69b, and (iii) the XY-axis guide surface 60a and the XY-axis moving surface 69c. In other words, an XY table, which is a non-contact biaxial moving table, is obtained via in seven planes.

Accordingly, the movement of the XY-axis moving table 69 to any desired position along the X and Y axes can be automatically controlled by mounting (a) the coil 40a of the X-axis voice coil motor 40 to the Y-axis guide section 64 of the X-axis moving table 61, (b) the magnet 40b of the X-axis voice coil motor 40 to the guide table 60, (c) the coil 42a of the Y-axis voice coil motor 42 to the X-axis guide section 68 of the Y-axis moving table 65, and (d) the magnet 42b of the Y-axis voice coil motor 42 to the guide table 60.

Figure 16:
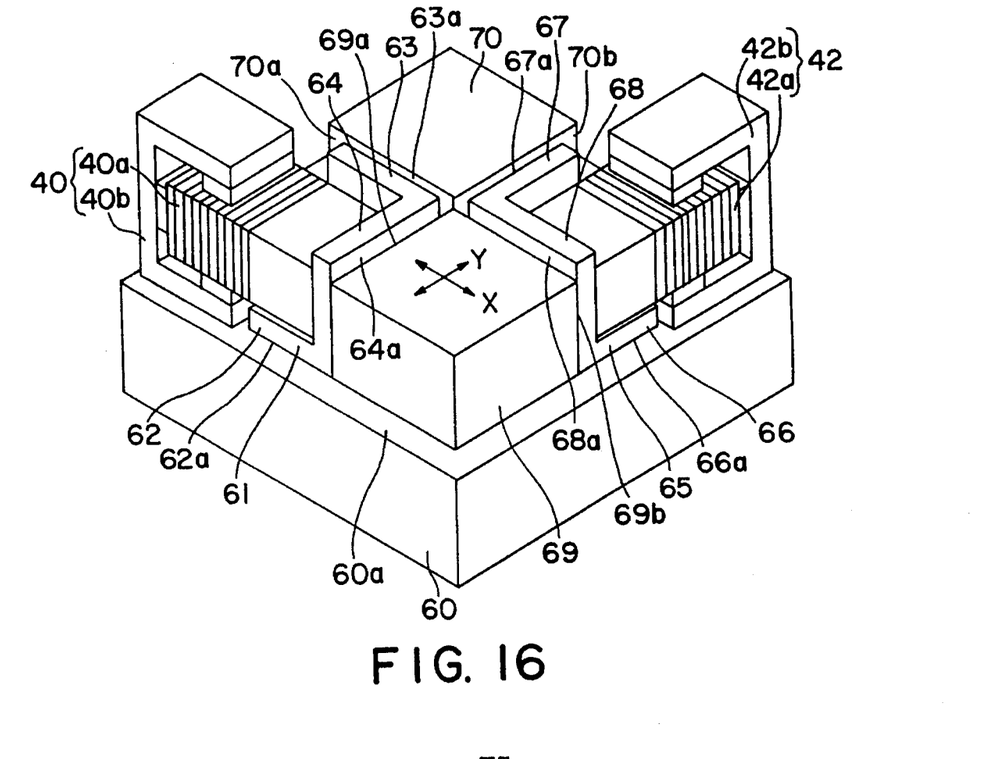
FIG. 16 illustrates a fifth embodiment of a non-contact type biaxial moving table according to the present invention.

FIG. 16 illustrates a fifth embodiment, which is a modification of the embodiment shown in FIG. 15 and is a biaxial or two direction moving table. The components which are the same as those shown in FIG. 15 or which correspond to those shown in FIG. 15, are labeled with the same reference numerals.

In this embodiment, an XY-axis guide section 70 which projects vertically upward from the guide table 60 is utilized instead of the X-axis guide surface 60b and Y-axis guide surface 60c of the guide table 60 of embodiment of FIG. 15.

An X-axis guide surface 70a which is parallel to the X axis and a Y-axis guide surface 70b which is parallel to the Y axis are formed on this XY-axis guide section 70. Accordingly, the X-axis moving section 63 of the X-axis moving table 61 extends vertically upward, as does the Y-axis moving section 67 of the Y-axis moving table 65. Furthermore, an X-axis moving surface 63a which is parallel to the X axis is formed on the X-axis moving section 63, and a Y-axis moving surface 67a which is parallel to the Y axis is formed on the Y-axis moving section 67.

With the structure described above, an effect the same as that obtained in the previous embodiments can be obtained.

Figure 17:
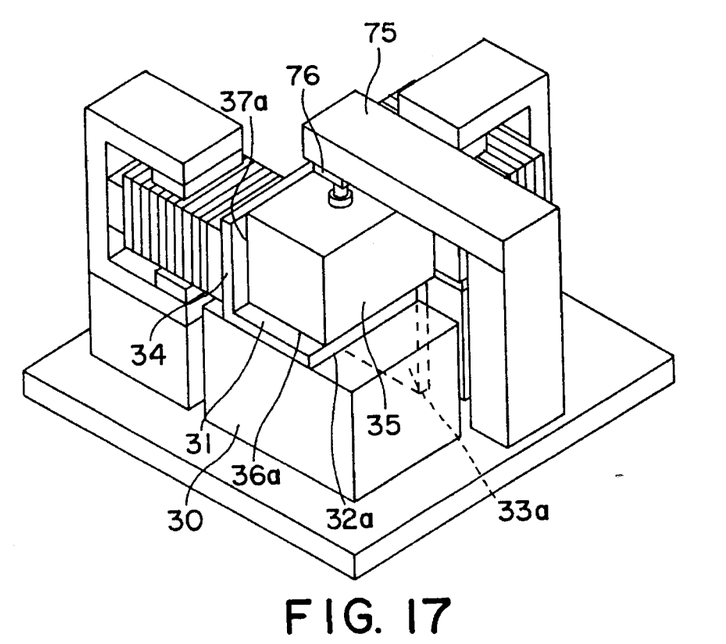
FIG. 17 illustrates a sixth embodiment of a non-contact type biaxial moving table according to the present invention.

FIG. 17 illustrates a sixth embodiment of the present invention. This embodiment shows an example applied in the embodiment of FIG. 12, and the Y-axis moving table 35 is a box-shaped table.

In the device of FIG. 12, the X-axis moving table 31 and Y-axis moving table 35 are not restrained by the X-axis voice coil motor 40 and Y-axis voice coil motor 42 when the X-axis voice coil motor 40 and the Y-axis voice coil motor 42 are both switched off. Accordingly, the moving tables 31 and 35 tend to move easily in their axial directions.

In order to prevent this, in this sixth embodiment of FIG. 17, an air cylinder 76 is utilized. The air cylinder 76 is provided on a supporting column 75 so that the Y-axis moving table 35 is clamped or positionally fixed by the air cylinder 76.

If the air cylinder is employed in the embodiments of FIGS. 13 and 14, the second XY-axis moving table 50 and the first XY-axis moving table 46 are clamped or positionally fixed by the air cylinder, and in the embodiments in FIG. 15 and 16, the XY-axis moving table 69, the X-axis moving table 61 and the Y-axis moving table 65 are clamped or positionally fixed by the air cylinder.

Figure 18:
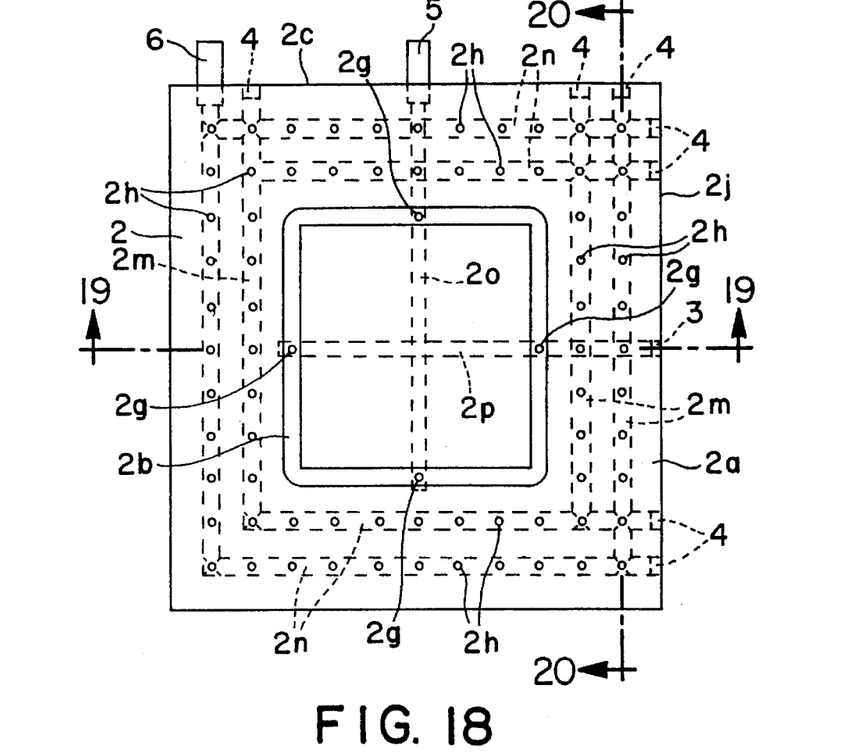
FIG. 18 shows the moving surface of a moving table according to the basic structure according to another embodiment of the non-contact type moving table of the present invention.
Figure 19:
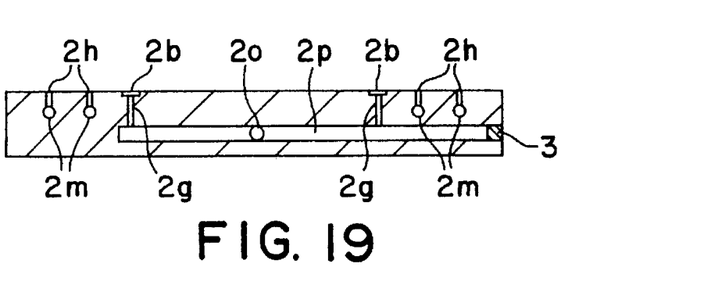
FIG. 19 is a cross section taken along the line 18—18 in FIG. 18.
Figure 20:
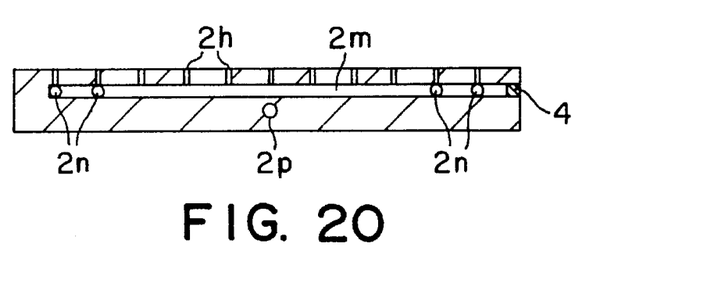
FIG. 20 is a cross section taken along the line 20—20 in FIG. 18.

FIGS. 18 through 20 illustrate the basic construction of the present invention which are different from one shown in FIGS. 1 through 6. In the basic structure illustrated in FIGS. 1 through 6, the air supply groove 2b is provided along the four edges of the moving surface 2a (i.e., the undersurface of the moving table 2) of the moving table 2. In addition, the air supply holes 2g are formed at four points of the air supply groove 2b, and a plurality of vacuum suction holes 2h are opened in the moving surface 2a in the area surrounded by the air supply groove 2b.

In the embodiment shown in FIGS. 18 through 20, on the other hand, a plurality of vacuum suction holes 2h are formed along the four edges of the moving surface 2a. In addition, the air supply groove 2b is provided on an inner side of the vacuum suction holes 2h, and four air supply holes 2g are formed at a point of each one of the four sides of this air supply groove 2b.

More specifically, respective air passage holes 2m and 2n are formed inwardly from the side surfaces 2c and 2j, so that the air passage holes 2m and 2n are connected with the vacuum suction holes 2h. The end portions of these air passage holes 2m and 2n located on the side surfaces 2c and 2j are closed off by plugs 4 except for one air passage hole 2m that is left open on the side surface 2c. The air suction pipe 6 is connected to this opened air passage hole 2m. Furthermore, air passage holes 2o and 2p are formed along the side surfaces 2c and 2j so that the air passage holes 2o and 2p are connected to the air supply holes 2g. The end of the air passage hole 2p located on the side surface 2j is closed off by a plug 3. An air supply pipe 5 is connected to the air passage hole 2o.

The same effect can be obtained with the moving table constructed in this manner as shown in FIGS. 18 to 20.

Figure 21:
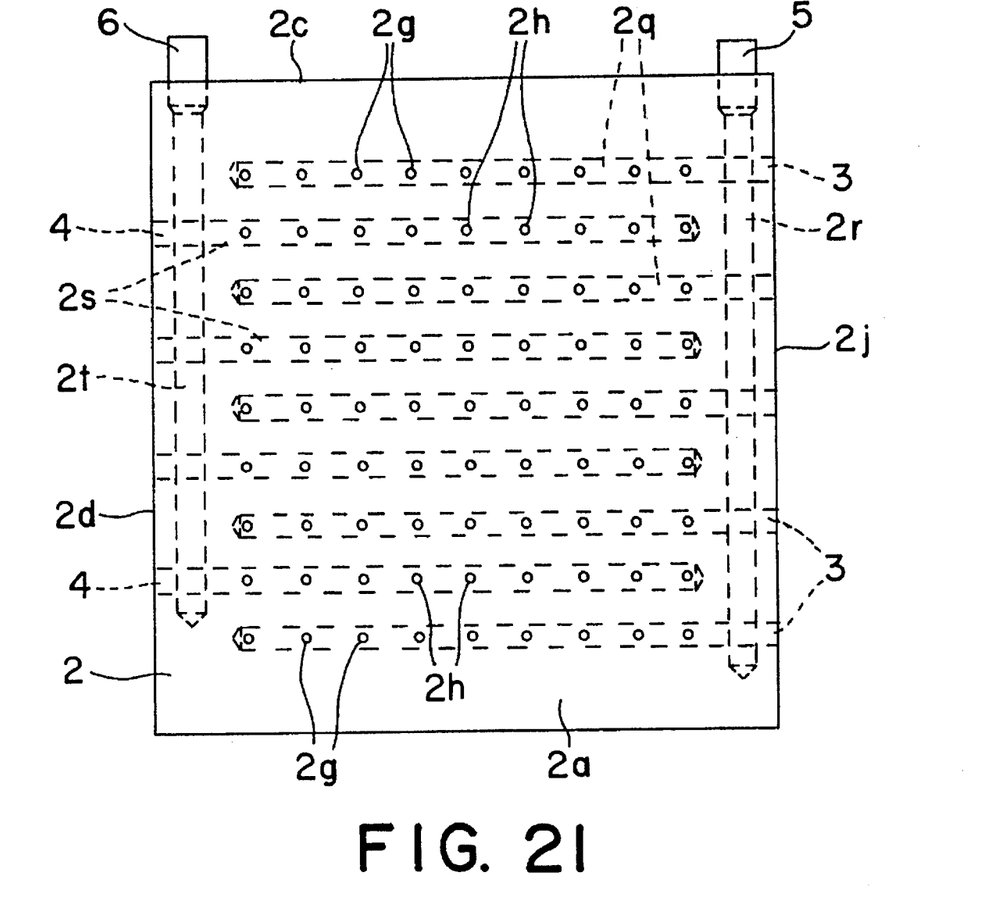
FIG. 21 shows the moving surface of a moving table according to the basic structure according to still another embodiment of the non-contact type moving table of the present invention.
Figure 22:
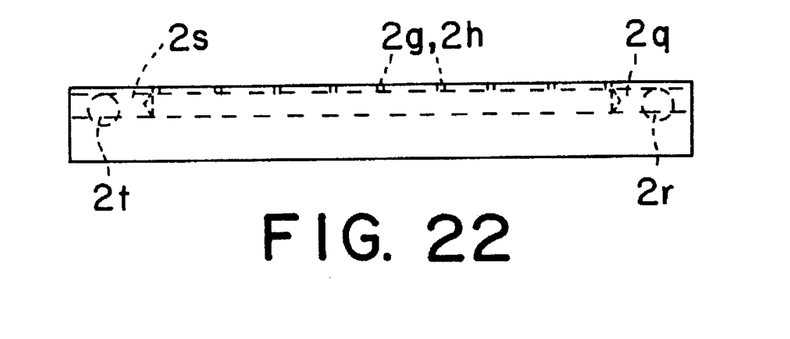
FIG. 22 is a side view thereof.

FIGS. 21 and 22 illustrate yet another basic structure of the present invention which is different from those shown in FIGS. 1 through 6 and FIGS. 18 through 20.

In this embodiment shown in FIGS. 21 and 22, a plurality of air supply holes 2g and vacuum suction holes 2h are formed in respective lateral rows in the moving surface 2a, and these rows are arranged so that rows of air supply holes 2g alternate with rows of vacuum suction holes 2h.

More specifically, air passage holes 2q are formed inwardly from the side surface 2j so that the air passage holes 2q are connected to the air supply holes 2g. In addition, an air passage hole 2r is formed inwardly from the side surface 2c so that the air passage hole 2r is connected with the air passage holes 2q. The ends of the air passage holes 2q located on the side surface 2j are closed off by plugs 3. An air supply pipe 5 is connected to the air passage hole 2r.

On the other hand, air passage holes 2s are formed inwardly from the side surface 2d so that the air passage holes 2s are connected to the vacuum suction holes 2h. An air passage hole 2t is formed inwardly from the side surface 2c so that the air passage hole 2t is connected with the air passage holes 2s. The ends of the air passage holes 2s located on the side surface 2d are closed off by plugs 4. An air suction pipe 6 is connected to the air passage hole 2t.

The same effect as that described above can be obtained with the moving table 2 shown in FIGS. 21 and 22. In this embodiment, furthermore, the air supply holes 2g and the air suction holes 2h may be formed in longitudinal rows instead of lateral rows.

The following further modifications can be made within the scope of the present invention:

a. The combination of the moving table and the guide table in each one of the embodiments of the above described moving tables includes the moving surface and the guide surface which are perpendicular (or at right angles) to each other (see, for example, the guide surfaces 22a and 23a in FIG. 10, and 20a and 25a in FIG. 11). However, these guide surfaces and moving surfaces can be positioned at a certain angle and not at right angles relative to each other.

b. In the embodiments described above, the air supply groove 2b, air supply holes 2g and vacuum suction holes 2h are formed in the moving surface 2a. However, it is possible to form these grooves and holes in the guide surface of the guide table.

c. It is also possible to form the air supply groove 2b and air supply holes 2g in one of the surfaces, i.e., either in the moving surface 2a or in the guide surface 1a, and to form the vacuum suction holes 2h in the other surface.

d. In the embodiments shown in FIGS. 1 through 6 and FIGS. 18 through 20, the air supply groove 2b is employed. However, it is possible, by omitting the air supply groove 2b, to form a plurality of air supply holes 2g in the area that corresponds to the air supply groove 2b.

As seen from the above, according to the present invention, the moving table system includes a guide table and a moving table. The guide table has a guide surface which is a plane, top surface of the guide table, and the moving table has a moving surface which faces the guide surface of the guide table. The moving table includes air supply holes that supply compressed air from the moving surface to the guide surface of the guide table, and the moving table further includes vacuum suction holes for vacuum suctioning from the guide surface of the guide table, thus forming a non-contact rigid bearing or support system of a single surface between the guide surface and the moving surface.

Accordingly, the structure is simple and less surfaces are used. In addition, the moving table system can be compact and light weight and is manufactured at low costs. In addition, materials of a broad range of kinds are used for making the table system.

We claim:

1. A non-contact type XY moving table for a semiconductor processing machine comprising:

a guide table having a guide surface which is a plane, top surface thereof; and a moving table installed on said guide table, said moving table having a moving surface which faces said guide surface of said guide table; and wherein a plurality of air supply holes are provided on said moving surface;

a source of compressed air is coupled to said air supply holes so that compressed air is supplied from said moving surface to said guide table:

a plurality of vacuum suction holes are provided on said moving surface;

a source of vacuum is coupled to said vacuum supply holes;

said plurality of said air supply holes and said vacuum suction holes are arranged in parallel rows, and said rows of said air supply holes and rows of said vacuum suction holes are arranged alternately;

so that a single plane, non-contact rigid bearing is provided between said guide surface of said guide table and said moving surface of said moving table.

* * * * *